(12) United States Patent
Haener et al.

(10) Patent No.: US 11,699,002 B2
(45) Date of Patent: Jul. 11, 2023

(54) SEPARABLE-STATE SIMULATION OF QUANTUM PROGRAM CODE

(71) Applicant: Microsoft Technology Licensing, LLC, Redmond, WA (US)

(72) Inventors: Thomas Haener, Zug (CH); Vadym Kliuchnikov, Redmond, WA (US); Martin Henri Roetteler, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 500 days.

(21) Appl. No.: 16/886,620

(22) Filed: May 28, 2020

(65) Prior Publication Data

US 2021/0374307 A1    Dec. 2, 2021

(51) Int. Cl.
*G06F 30/20* (2020.01)
*G06N 10/00* (2022.01)

(52) U.S. Cl.
CPC ............. *G06F 30/20* (2020.01); *G06N 10/00* (2019.01)

(58) Field of Classification Search
CPC .......... G06F 30/00; G06F 30/20; G06N 10/00
USPC ............................... 703/21, 14, 13
See application file for complete search history.

(56) References Cited

U.S. PATENT DOCUMENTS

| | | | |
|---|---|---|---|
| 2020/0372392 A1* | 11/2020 | Nam ...................... | H04B 10/70 |
| 2020/0394545 A1* | 12/2020 | Kliuchnikov .......... | G16C 10/00 |
| 2021/0194507 A1* | 6/2021 | Delfosse ................ | G06N 10/00 |

FOREIGN PATENT DOCUMENTS

| | | | | |
|---|---|---|---|---|
| CN | 108780129 A | * | 11/2018 | ............. G01R 23/16 |
| WO | 2020010208 A1 | | 1/2020 | |

OTHER PUBLICATIONS

Mahmud, Naveed et al., "Modifying Quantum Grover's Algorithm for Dynamic Multi-Pattern Search on Reconfigurable Hardware", Apr. 22, 2020, Springer Science Business Media, LLC. (Year: 2020).*

Radtke, T. et al., "Simulation of N-Qubit Quantum Systems I: Quantum Registers and Quantum Gates", Aug. 29, 2005, Computer Physics Communications 173. (Year: 2005).*

Hillmich, Stefan et al., "Concurrency in DD-Based Quantum Circuit Simulation", 2020, IEEE. (Year: 2020).*

(Continued)

*Primary Examiner* — Cedric Johnson

(74) *Attorney, Agent, or Firm* — Alleman Hall Creasman & Tuttle LLP

(57) ABSTRACT

A method to digitally simulate an evolving quantum state of a qubit register of a quantum computer is enacted in a computer system. The quantum state is represented as an array of complex-valued amplitudes, where each amplitude is associated with an individual qubit of the qubit register, and where the quantum state is separable as a product of the individual quantum states of each qubit. One or more quantum-program instructions corresponding to a quantum circuit are received, and the amplitudes of the array are adjusted to reflect a change in the quantum state pursuant to execution of the quantum circuit, the change preserving the separability of the quantum state as a product of individual quantum states of each qubit. One or more of the adjusted amplitudes are then outputted computationally, in such form as to be receivable as input to a computer program.

20 Claims, 9 Drawing Sheets

(56) References Cited

OTHER PUBLICATIONS

Abbott, Alastair A., "De-quantisation of the Quantum Fourier Transform", In Repository of arXiv:1006.3989, Jan. 24, 2020, 14 Pages.
Radtke, et al., "Simulation of n-qubit Quantum Systems. II. Separability and Entanglement", In Journal of Computer Physics Communications, vol. 175, No. 2, Jul. 15, 2006, pp. 145-166.
Jorrand, et al., "On the Distinction between Entangled and Separable States of Quantum Registers", In Proceedings of the 2nd IEEE Conference on Nanotechnology, Aug. 27, 2002, pp. 301-304.
Li, et al., "Poq: Projection-based Runtime Assertions for Debugging on a Quantum Computer", In Repository of arXiv:1911.12855v1, Nov. 28, 2019, 20 Pages.
"International Search Report and Written Opinion Issued in PCT Application No. PCT/US2021/020456", dated Jun. 18, 2021, 30 Pages.
Radtke, et al., "Simulation of n-qubit Quantum Systems. I. Quantum Registers and Quantum Gates", In Journal of the Computer Physics Communications, vol. 173, Issues 1-2, Dec. 1, 2005, pp. 91-113.
Aaronson, et al., "Improved Simulation of Stabilizer Circuits", In Journal of Physical Review A, vol. 70, Issue 5, Nov. 30, 2004, 15 Pages.
Bravyi, et al., "Improved Classical Simulation of Quantum Circuits Dominated by Clifford Gates", In Journal of Physical Review Letters, vol. 116, Issue 25, Jun. 20, 2016, 5 Pages.
Draper, Thomas G., "Addition on a Quantum Computer", In Repository of arXiv:quant-ph/0008033v1, Aug. 7, 2000, 8 Pages.
Gidney, Craig, "Halving the Cost of Quantum Addition", In Journal of Quantum, vol. 2, Jun. 14, 2018, 6 Pages.
Haner, et al., "0.5 Petabyte Simulation of a 45-Qubit Quantum Circuit", In Proceedings of the International Conference for High Performance Computing, Networking, Storage and Analysis, Nov. 12, 2017, 10 Pages.
Haner, et al., "Factoring Using 2n+ 2 Qubits with Toffoli Based Modular Multiplication", In Repository of arXiv:1611.079952, Jun. 1, 2017, 12 Pages.
Haner, et al., "High Performance Emulation of Quantum Circuits", In Proceedings of the International Conference for High Performance Computing, Networking, Storage and Analysis, Nov. 13, 2016, pp. 866-874.
Jones, Cody, "Novel Constructions for the Fault-Tolerant Toffoli Gate", In Repository of arXiv:1212.5069v1, Dec. 20, 2012, 5 Pages.
Nielsen, et al., "Quantum Computation and Quantum Information", Published by Cambridge University Press, 2010, 704 Pages.

\* cited by examiner

US 11,699,002 B2

SEPARABLE-STATE SIMULATION OF QUANTUM PROGRAM CODE

BACKGROUND

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and machine learning.

SUMMARY

One aspect of this disclosure relates to a method, enacted in a computer system, to digitally simulate an evolving quantum state of a qubit register of a quantum computer. In this method, the quantum state is represented as an array of complex-valued amplitudes, where each amplitude is associated with an individual qubit of the qubit register, and where the quantum state is separable as a product of the individual quantum states of each qubit. One or more quantum-program instructions corresponding to a quantum circuit are received, and the amplitudes of the array are adjusted to reflect a change in the quantum state pursuant to execution of the quantum circuit, the change preserving the separability of the quantum state as a product of individual quantum states of each qubit. One or more of the adjusted amplitudes are outputted computationally, in such form as to be receivable as input to a computer program.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

DETAILED DESCRIPTION

This disclosure presents efficient methods for digitally simulating, testing, and debugging quantum programs that implement high-level classical functionality. These methods are not restricted to quantum circuits based on Toffoli gates but extend to virtually any quantum circuit that preserves separability among individual qubit states. In contrast to full-state quantum simulation, the disclosed methods enable testing and debugging of complex quantum programs using manageable computational resources. In particular, the number of operations and memory requirements for the disclosed methods scale exponentially better than full-state simulation in the number of qubits.

Figure 3:
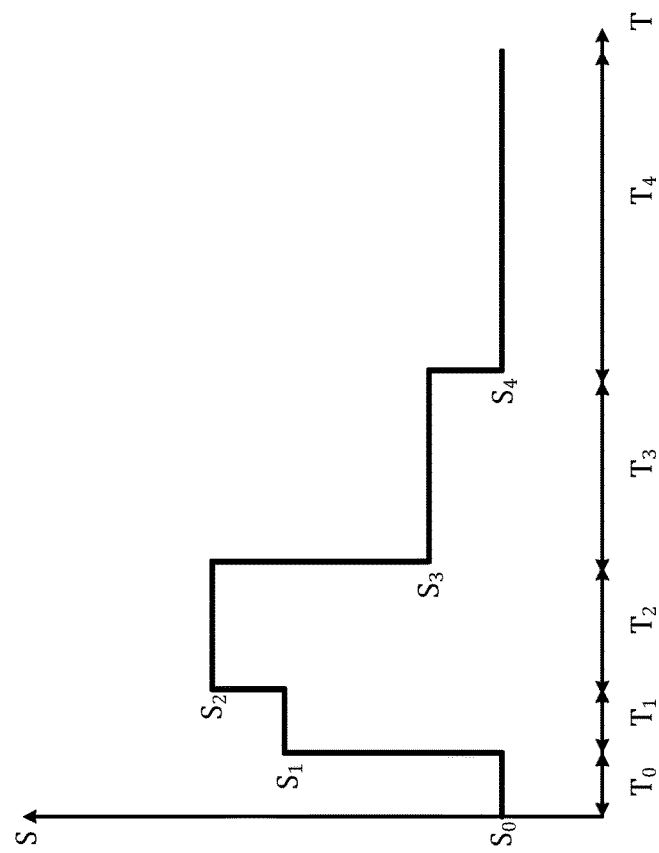
FIG. 3 shows aspects of an example signal waveform for effecting a quantum-gate operation in a quantum computer.

Prior to exploring quantum-code simulation, some aspects of quantum-computer architecture will first be described, with reference to FIGS. 1, 2, and 3.

Quantum Computer Architecture

Figure 1:
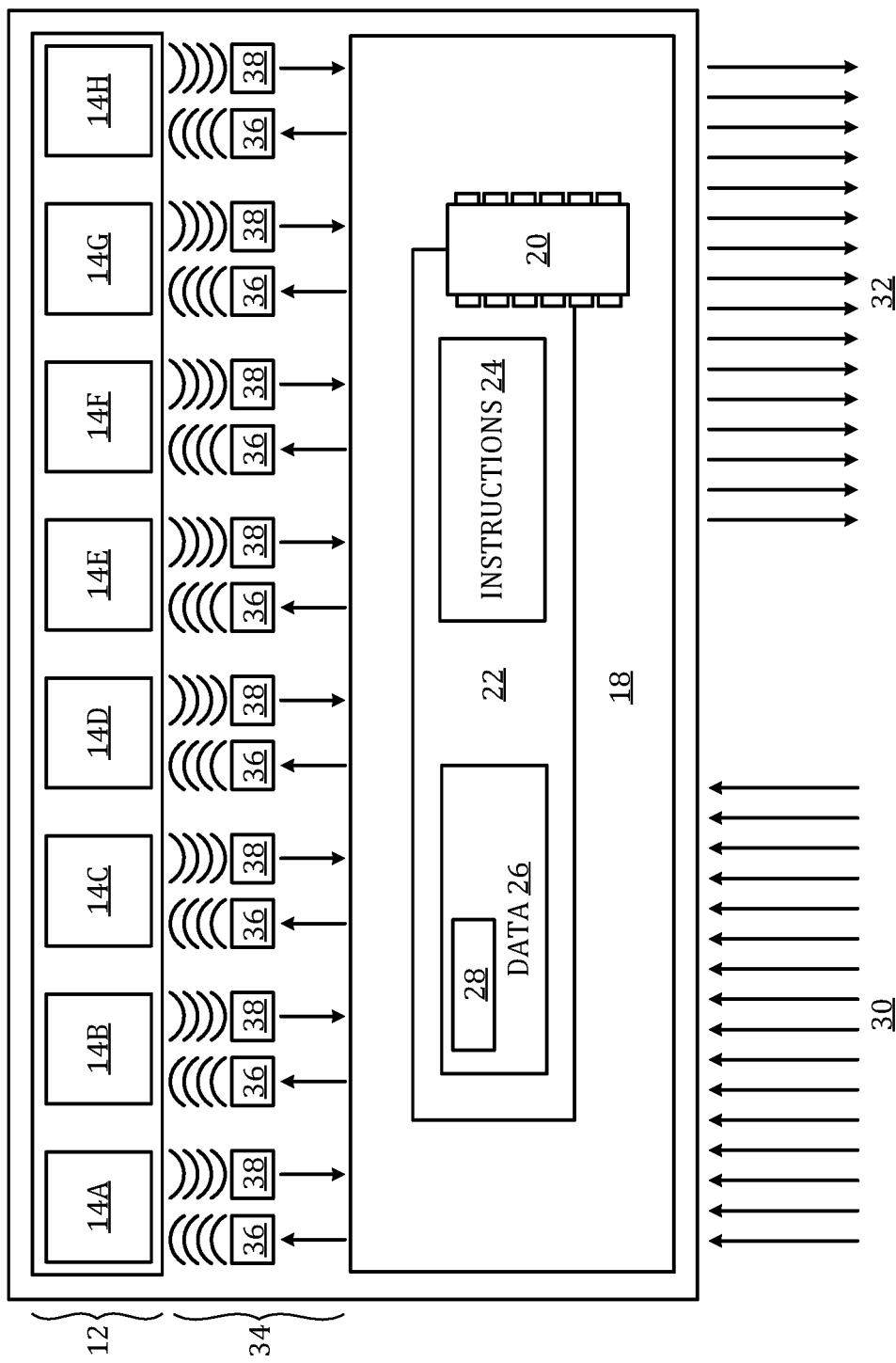
FIG. 1 shows aspects of an example quantum computer.

FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes at least one qubit register 12 comprising an array of qubits—viz., qubit 14A, qubit 14B, . . . qubit 14H. The illustrated qubit register is eight qubits in length; qubit registers comprising longer and shorter qubit arrays are also envisaged, as are quantum computers comprising two or more qubit registers of any length.

The qubits H of qubit register 12 may take various forms, depending on the desired architecture of quantum computer 10. Each qubit may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. More generally, each qubit may comprise any particle or system of particles that can exist in two or more discrete quantum states that can be measured and manipulated experimentally. For instance, a qubit may be implemented in the plural processing states corresponding to different modes of light propagation through linear optical elements (e.g., mirrors, beam splitters and phase shifters), as well as in states accumulated within a Bose-Einstein condensate.

Figure 2:
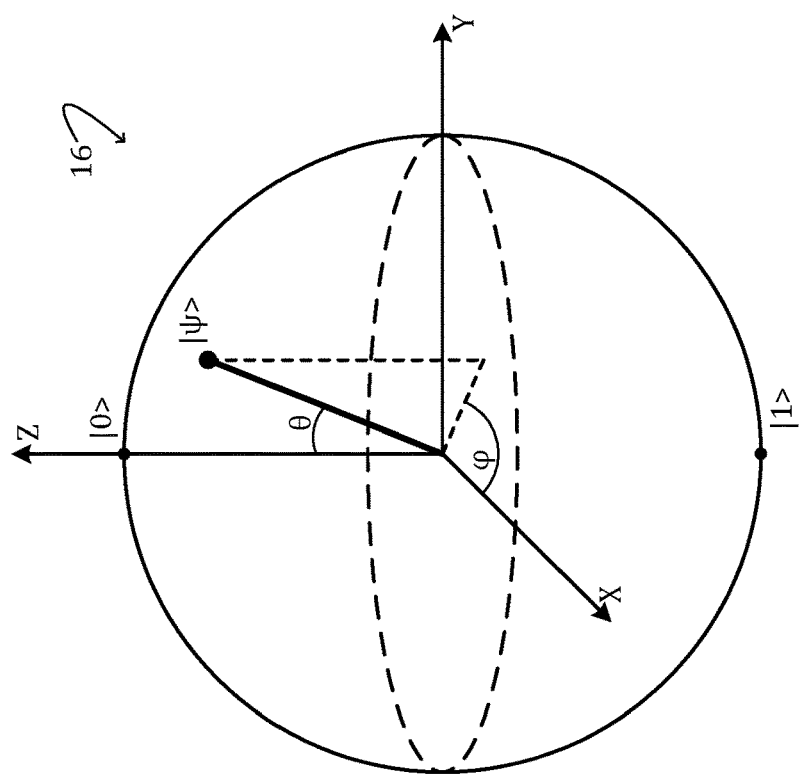
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit. In this description, the north and south poles of the Bloch sphere correspond to the standard basis vectors |0⟩ and |1⟩, respectively—up and down spin states, for example, of an electron or other fermion. The set of points on the surface of the Bloch sphere comprise all possible pure states |ψ⟩ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18. The controller may include at least one processor 20 and associated computer memory 22. A processor 20 of controller 18 may be coupled operatively to peripheral componentry, such as network componentry, to enable the quantum computer to be operated remotely. A processor 20 of controller 18 may take the form of a central processing unit (CPU), a graphics processing unit (GPU), or the like. As such, the controller may comprise classical electronic componentry. The terms 'classical' and 'non-quantum' are applied herein to any component that can be modeled accurately as an ensemble of particles without considering the quantum state of any individual particle. Classical electronic components include integrated, microlithographed transistors, resistors, and capacitors, for example.

Computer memory 22 may be configured to hold program instructions 24 that cause processor 20 to execute any function or process of controller 18. The computer memory may also be configured to hold data 26. In some examples, data 26 may include a register of classical control bits 28 that influence the operation of the quantum computer during runtime—e.g., to provide classical control input to one or more quantum-gate operations (vide infra). In examples in which qubit register 12 is a low-temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 30 and to provide a plurality of outputs 32. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit register 12 via quantum interface 34. The quantum interface is configured to exchange data bidirectionally with the controller. The quantum interface is further configured to exchange signal corresponding to the data bidirectionally with the qubit register. Depending on the architecture of quantum computer 10, such signal may include electrical, magnetic, and/or optical signal. Via signal conveyed through the quantum interface, the controller may interrogate and otherwise influence the quantum state held in the qubit register, as defined by the collective quantum state of the array of qubits. To this end, the quantum interface includes at least one modulator 36 and at least one demodulator 38, each coupled operatively to one or more qubits of the qubit register. Each modulator is configured to output a signal to the qubit register based on modulation data received from the controller. Each demodulator is configured to sense a signal from the qubit register and to output data to the controller based on the signal. The data received from the demodulator may, in some examples, be an estimate of an observable to the measurement of the quantum state held in the qubit register. Taken together, the controller, modulator, and demodulator may be referred to as a 'controller system'.

In some examples, suitably configured signal from modulator 36 may interact physically with one or more qubits of qubit register 12 to trigger measurement of the quantum state held in one or more qubits. Demodulator 38 may then sense a resulting signal released by the one or more qubits pursuant to the measurement, and may furnish the data corresponding to the resulting signal to controller 18. Stated another way, the demodulator may be configured to output, based on the signal received, an estimate of one or more observables reflecting the quantum state of one or more qubits of the qubit register, and to furnish the estimate to the controller. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 34 may be configured to implement one or more quantum-logic gates to operate on the quantum state held in qubit register 12. Whereas the function of each type of logic gate of a classical computer system is described according to a corresponding truth table, the function of each type of quantum gate is described by a corresponding operator matrix. The operator matrix operates on (i.e., multiplies) the complex vector representing the qubit register state and effects a specified rotation of that vector in Hilbert space.

For example, the Hadamard gate H is defined by $$H = \frac{1}{\sqrt{2}}\begin{bmatrix} 1 & 1 \\ 1 & -1 \end{bmatrix} \quad (1)$$

The H gate acts on a single qubit; it maps the basis state |0⟩ to (|0⟩+|1⟩)/√2, and maps |1⟩ to (|0⟩−|1⟩)/√2. Accordingly, the H gate creates a superposition of states that, when measured, have equal probability of revealing |0) or |1).

The phase gate S is defined by $$S = \begin{bmatrix} 1 & 0 \\ 0 & e^{i\pi/2} \end{bmatrix}. \quad (2)$$

The S gate leaves the basis state |0) unchanged but maps |1) to $e^{i\pi/2}$|1⟩. Accordingly, the probability of measuring either |0) or |1) is unchanged by this gate, but the phase of the quantum state of the qubit is shifted. This is equivalent to rotating ψ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{bmatrix} 1 & 0 & 0 & 0 \\ 0 & 0 & 1 & 0 \\ 0 & 1 & 0 & 0 \\ 0 & 0 & 0 & 1 \end{bmatrix}. \quad (3)$$

The foregoing list of quantum gates and associated operator matrices is non-exhaustive, but is provided for ease of illustration. Other quantum gates include Pauli-X, −Y, and −Z gates, the $\sqrt{NOT}$ gate, additional phase-shift gates, the $\sqrt{SWAP}$ gate, controlled cX, cY, and cZ gates, and the Toffoli, Fredkin, Ising, and Deutsch gates, as non-limiting examples.

Continuing in FIG. 1, suitably configured signal from modulators 36 of quantum interface 34 may interact physically with one or more qubits of qubit register 12 so as to assert any desired quantum-gate operation. As noted above, the desired quantum-gate operations are specifically defined rotations of a complex vector representing the qubit register state. In order to effect a desired rotation O, one or more modulators of quantum interface 34 may apply a predetermined signal level $S_i$ for a predetermined duration $T_i$. In some examples, plural signal levels may be applied for plural sequenced or otherwise associated durations, as shown in FIG. 3, to assert a quantum-gate operation on one or more qubits of the qubit register. In general, each signal level $S_i$ and each duration $T_i$ is a control parameter adjustable by appropriate programming of controller 18.

The terms 'oracle' and 'quantum program' are used herein to describe a predetermined sequence of elementary quantum-gate and/or measurement operations executable by quantum computer 10. An oracle may be used to transform the quantum state of qubit register 12 to effect a classical or non-elementary quantum-gate operation or to apply a density operator, for example. In some examples, an oracle may be used to enact a predefined 'black-box' operation $f(x)$, which may be incorporated in a complex sequence of operations. To ensure adjoint operation, an oracle mapping n input qubits $|x\rangle$ to m output or ancilla qubits $|y\rangle = f(x)$ may be defined as a quantum gate $O(|x\rangle \otimes |y\rangle)$ operating on the n+m qubits. In this case, O may be configured to pass the n input qubits unchanged but combine the result of the operation $f(x)$ with the ancillary qubits via an XOR operation, such that $O(|x\rangle \otimes |y\rangle) = |x\rangle \otimes |y \otimes f(x)\rangle$.

Implicit in the description herein is that each qubit of qubit register 12 may be interrogated via quantum interface 34 so as to reveal with confidence the standard basis vector $|0\rangle$ or $|1\rangle$ that characterizes the quantum state of that qubit. In some implementations, however, measurement of the quantum state of a physical qubit may be subject to error. Accordingly, any qubit may be implemented as a logical qubit, which includes a grouping of physical qubits measured according to an error-correcting oracle that reveals the quantum state of the logical qubit with above-threshold confidence.

Quantum Circuit Simulation

This disclosure concerns simulation, on a classical digital computer, of program code formulated for execution on a quantum computer. Accurate simulation offers an opportunity to test and debug quantum programs without requiring access to a quantum computer. In the general case, the computational effort required to model a multiqubit quantum state increases exponentially with the number of qubits in the qubit register of the quantum computer. A full-state simulation is feasible, therefore, only when the number of qubits is small. When the range of transformations on the quantum state is subject to appropriate restrictions, however, more efficient simulations can be used.

For instance, a typical quantum program may include various procedures (e.g., functions and methods), that compute a classical function, albeit on a superposition of inputs. It is possible to implement classical functionality using the Toffoli gate, a 3-bit reversible analogue of the classical AND gate, which can be realized on a quantum computer using a fault-tolerant gate set. The output of the Toffoli gate comprises input a, input b, and result a AND b. The qubit transformation effected by the Toffoli gate is simulated efficiently by a dedicated 'Toffoli simulator'. For a function $f: \{0, 1\}^n \rightarrow \{0, 1\}^n$, the Toffoli simulator keeps track of all n classical bits and updates the classical bits for each Toffoli gate by flipping the output bit if the two input bits are set to 1. For actual operation on a quantum computer, each Toffoli gate may be translated to the Clifford+T gate set using, for example, seven T-gates in addition to Clifford gates.

Although the Toffoli gate is simulated efficiently using a dedicated simulator, its execution on a fault-tolerant quantum computer is expensive because of T-gate utilization. The Toffoli circuit can be optimized, however, by adding auxiliary qubits so that some Toffoli gates exactly compute the AND of the inputs into the output qubit, as opposed to flipping an arbitrary output qubit state. Subsequent uncomputation of the auxiliary qubit can then be performed at no cost in terms of T-gates, allowing execution of each pair of original Toffoli gates (compute and uncompute) at a total cost of only four T-gates. This optimization lowers the execution overhead for the quantum circuit but renders the Toffoli simulator useless for debugging and testing.

To address these issues and provide further advantages, a quantum-code simulator that is more general than the Toffoli simulator, but much more efficient than any full-state simulator, is provided. The operation of the quantum-code simulator assumes only that the quantum state ψ of a qubit register is separable as a product of the quantum states co, of the individual qubits of the qubit register—viz., $$\psi = \prod_i \varphi_i. \quad (4)$$

That assumption is equivalent to saying that the individual qubit states are non-entangled.

A quantum-code simulator operating according to the above principle can handle highly generalized quantum implementations of classical functionality. As a further example, consider using Draper's addition in Fourier space as a subroutine in a larger quantum circuit that evaluates a classical function—e.g., multiplication of two n-qubit numbers. The adder performs a quantum Fourier transform, followed by an addition in phase space, followed by an inverse quantum Fourier transform to complete the addition. The adder is usually tested on a full-state simulator and restricted to a maximum of 30 to 40 qubits to limit the computational expense. However, when testing high-level functions that invoke the adder—e.g., evaluation of polynomials—that restriction is too prohibitive, as many ancilla qubits are needed for temporary storage of intermediate results.

Since the overall function being evaluated is classical, one may assume that the input to the adder is a classical bit-pattern. The quantum Fourier transform maps these so-called 'computational' basis states to separable states. Specifically, the computational basis state $|x_1, \ldots, x_n\rangle$, where $x_i \in \{0, 1\}$, is mapped to $$\frac{1}{\sqrt{n}}\left(|0\rangle + e^{i2\pi 0.x_n}|1\rangle\right)\left(|0\rangle + e^{i2\pi 0.x_{n-1}x_n}|1\rangle\right) \ldots \left(|0\rangle + e^{i2\pi 0.x_1 \ldots x_n}|1\rangle\right), \quad (5)$$

where $0 \cdot x_k \ldots x_n$ denotes a binary fraction, i.e., $$0.x_k \ldots x_n = \sum_{i=k}^{n} 2^{-i-1-k} x_i. \quad (6)$$

Using the standard implementation of a quantum Fourier transform in terms of controlled-phase gates and Hadamard gates, this circuit may be simulated, as all intermediate states are also separable. The addition in phase space modifies the separable state by applying a sequence of phase gates of the form $$R_k = \begin{pmatrix} 1 & 0 \\ 0 & e^{-2\pi i/2^k} \end{pmatrix}, \quad (7)$$

$$k \in N$$

to each qubit, thereby transforming the state to $$\frac{1}{\sqrt{n}}\left(|0\rangle + e^{i2\pi 0.y_n}|1\rangle\right)\left(|0\rangle + e^{i2\pi 0.y_{n-1}y_n}|1\rangle\right) \ldots \left(|0\rangle + e^{i2\pi 0.x_1 \ldots x_n}|1\rangle\right), \quad (8)$$

where $y_1 \ldots y_n$ is the binary representation of the result. The subsequent inverse quantum Fourier transform will now map this Fourier state back to the computational basis state $|y_1 \ldots y_n\rangle$.

Figure 4:
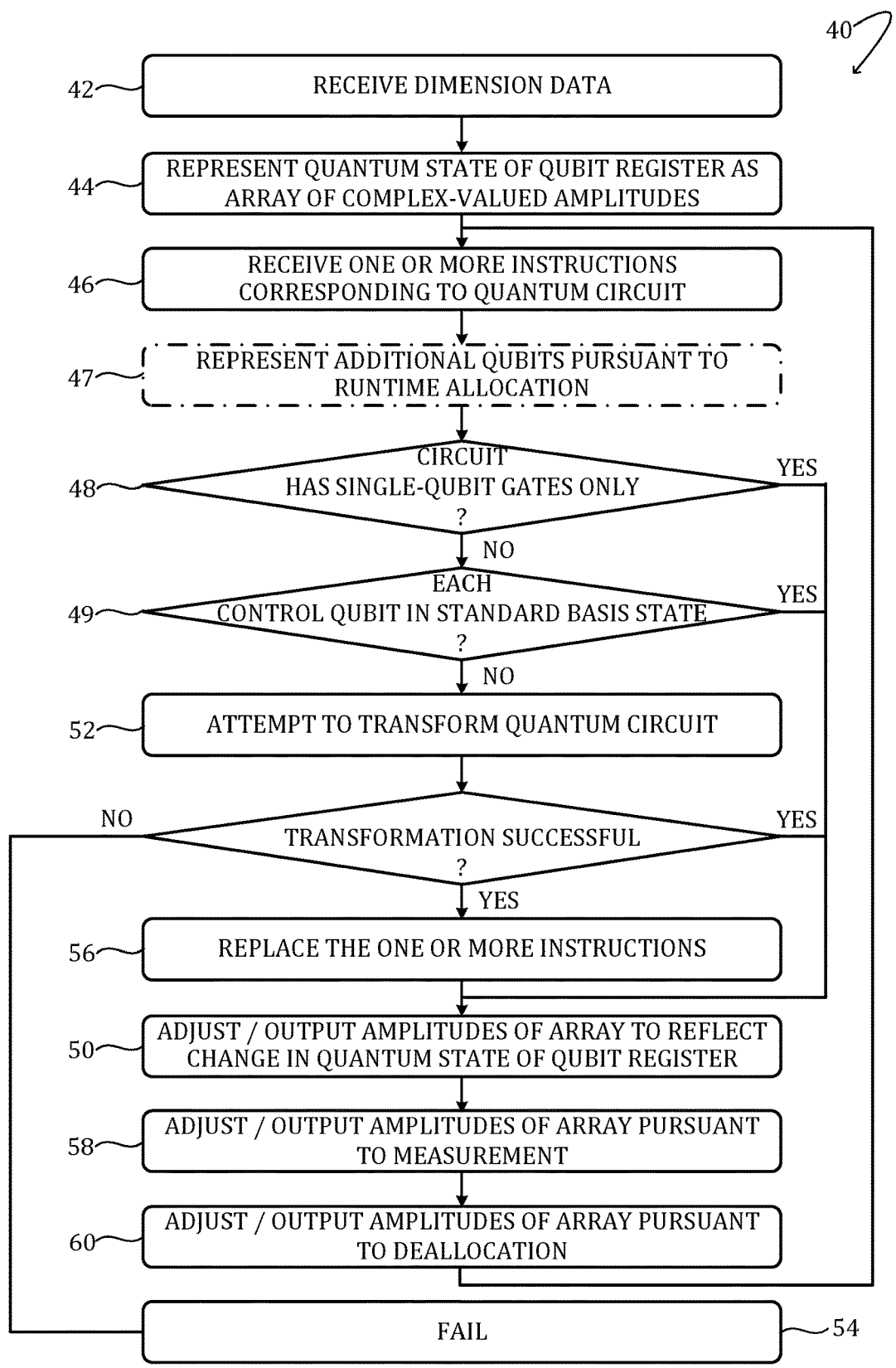
FIG. 4 shows aspects of an example method to digitally simulate an evolving quantum state of a qubit register of a quantum computer.

In light of the context above, FIG. 4 shows aspects of an example method 40 to digitally simulate an evolving quantum state of a qubit register of a quantum computer. Method 40, among other methods disclosed herein, may be implemented on a classical computer system as a computer program. The terms 'quantum-code simulator' and 'simulator' are used herein to describe computer-program implementations of method 40 and related methods.

At 42 of method 40, the quantum-code simulator receives dimension data that defines the dimensions of the qubit register of the quantum computer. The dimension data may specify the number of qubits in the qubit register. In some examples, the dimension data may specify the distribution of qubits among one or more primary and/or ancillary sub-registers.

At 44 the quantum-code simulator represents the quantum state of the qubit register as a variable array—i.e., a data structure held in the memory system of the computer system on which the simulator is run. The array comprises one row for each qubit. Each row i includes a complex-valued amplitude $\alpha_i$ representing the contribution of the standard basis $|0\rangle$ for qubit i and a complex-valued amplitude representing the contribution of the standard basis $|1\rangle$ for qubit i. In this representation, the overall quantum state $\psi$ of the qubit register is separable as a product of the individual quantum states of each qubit of the qubit register, as in eq 4. Depending on the implementation, amplitudes $\alpha_i$ and $\beta_i$ may be represented as floating-point numbers, fixed-point numbers, exact numbers, or symbolically. In some examples, the amplitudes corresponding to qubit i may receive their initial values at the point in the simulation where qubit i is first allocated. At that point the index i corresponding to the new qubit may be registered. As further described hereinafter, the separability condition enables the quantum-code simulator to operate more efficiently than any full-state simulator.

At 46 the quantum-code simulator receives one or more instructions corresponding to a quantum circuit. The quantum circuit may include one or more quantum gates, such as an X gate, a CNOT gate, a Toffoli gate, or n-ary controlled NOT gate, for example. The foregoing list is not exhaustive, as numerous other quantum gates are equally envisaged. In some scenarios, the instructions received may correspond to a quantum circuit that is conditional on the value of one or more other qubits and/or classical (controller) bits.

The one or more instructions received at 46 may be part of a longer or more complex quantum program configured for execution on a quantum computer. In some examples, accordingly, the instructions may be retrieved by parsing the quantum program for instructions corresponding to recognized, discrete quantum circuits, in order of execution of the discrete quantum circuits in the quantum program.

In some scenarios, the one or more instructions received at 46 may include a qubit-allocation instruction to be enacted at runtime. At 47, therefore, one or more additional qubits of the qubit register are represented in the array pursuant to any allocation instruction that may be received.

At 48 it is determined whether the each quantum gate of the quantum circuit corresponding to the instructions received is a single-qubit gate. As used herein, a 'single-qubit' gate may be uncontrolled or controlled based on one or more classical controller bits. At 49, for any quantum gate that is not a single-qubit gate, it is determined whether each control qubit is in one of the standard basis states $|0\rangle$ or $|1\rangle$ —i.e., whether $|\alpha_i|^2 \in \{0, 1\}$ for all control qubit identifiers i. Discrete quantum gates of either class are guaranteed to preserve the separability of the quantum state in the qubit register. Accordingly, instructions corresponding to quantum circuits having only such gates may be simulated directly (vide infra).

At 50 the quantum-code simulator adjusts the amplitudes of the array to reflect a change in the quantum state of the qubit register pursuant to execution of the quantum circuit defined by the instructions received. As noted above, the adjustment in method 40 reflects changes that preserve the separability of the quantum state as a product of individual quantum states of each qubit of the qubit register. For example, application of a NOT gate to qubit i of the register can be effected by interchange of $\alpha_i$ and $\beta_i$, which preserves separability.

Figure 5:
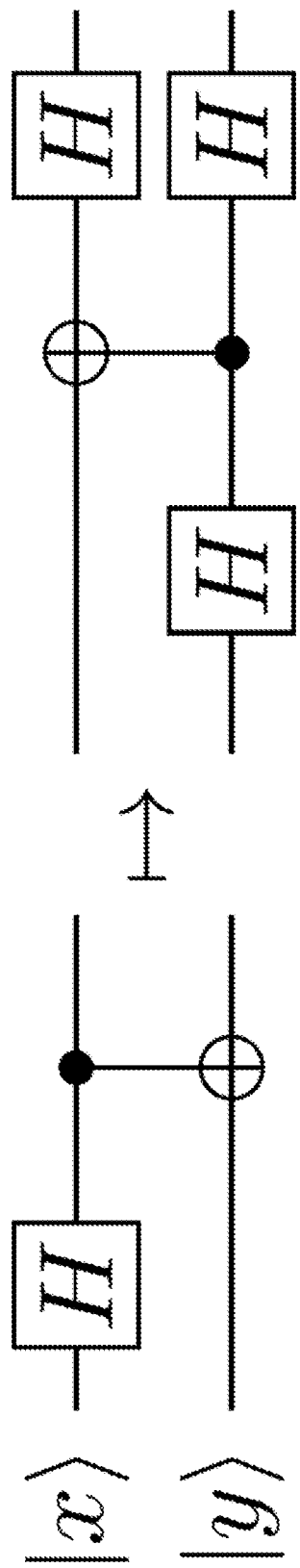
FIG. 5 illustrates a quantum-circuit transformation that exchanges the control and target qubits of a quantum gate if the control qubit comprises a superposition of basis states.
Figure 6:
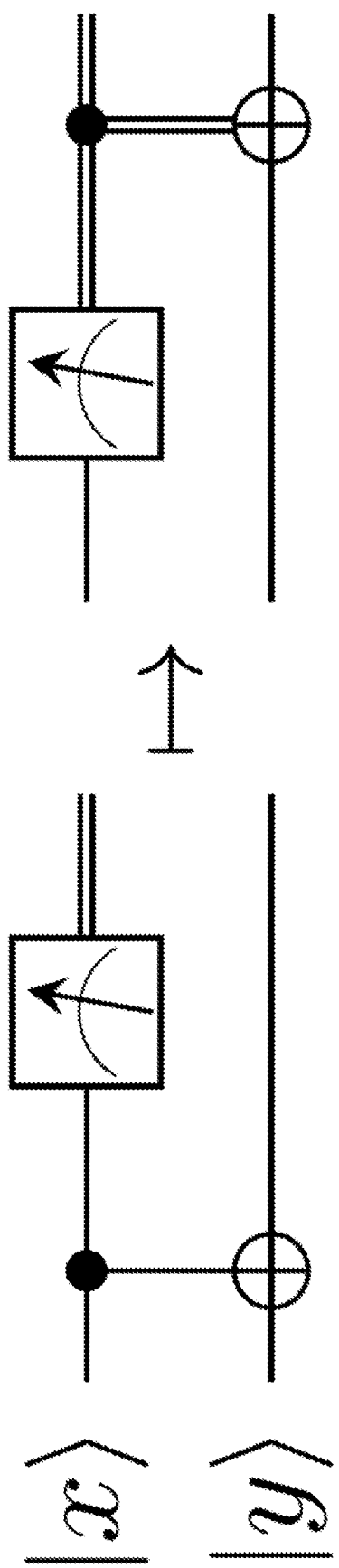
FIG. 6 illustrates a quantum-circuit transformation that allows a quantum gate to be controlled by a qubit in a superposition state if measurement immediately follows the controlled quantum gate.
Figure 7:
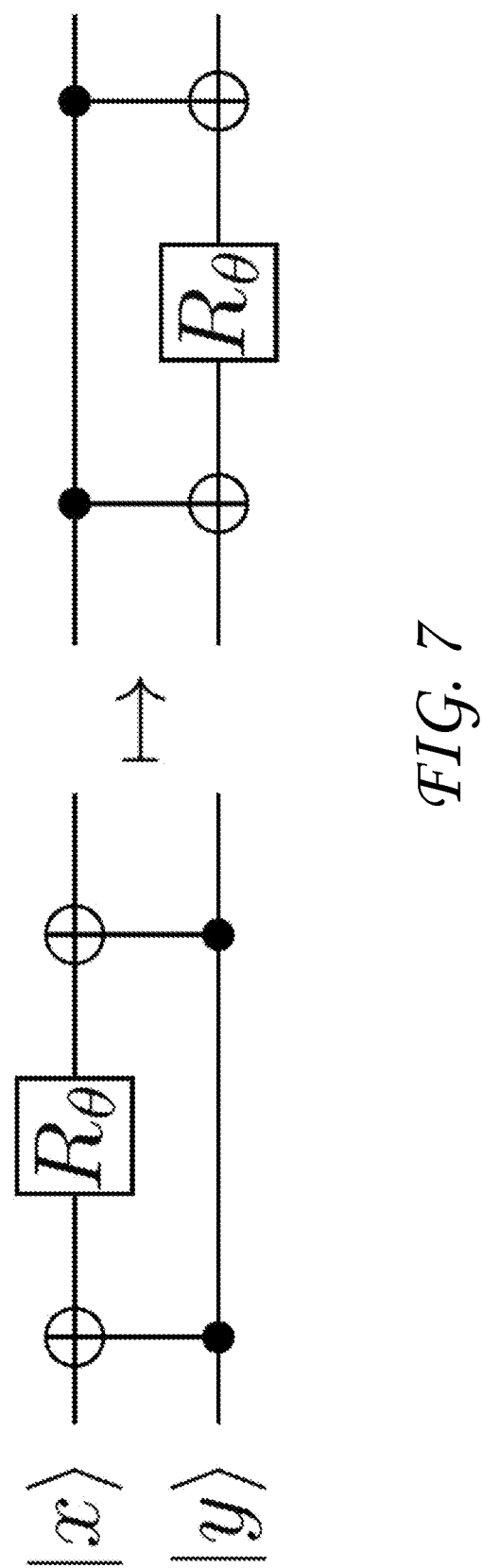
FIG. 7 illustrates a quantum-circuit transformation that changes the target of a temporary parity computation between qubits x and y.

If the quantum circuit corresponding to the instructions received at 46 includes a multi-qubit quantum gate or a controlled quantum gate with at least one control qubit in a superposition state, then method 40 advances to 52. At 52 the quantum-code simulator attempts to transform the quantum circuit to a functionally equivalent quantum circuit that preserves separability of the quantum state as a product of individual quantum states of each qubit of the qubit register. In some examples, the simulator may transform the quantum circuit such that every quantum gate is controlled by a qubit in one of the standard basis states. This action enables a wider range of circuits to be simulated. FIGS. 5 through 7 provide non-limiting examples of representative quantum-circuit transformations. In each case, a concrete input state is chosen merely for ease of illustration, as the depicted transformations apply to generic ranges of input states.

In some examples, a quantum circuit may include a controlled quantum gate with at least one control qubit in a superposition state. Here, transforming the quantum circuit may include exchanging control and target qubits of the controlled quantum gate. FIG. 5 illustrates a quantum-circuit transformation wherein the quantum-code simulator exchanges the control and target qubits of the quantum gate if the control qubit comprises a superposition of basis states. In the illustrated example, the transformation allows a CNOT to act on a target qubit in an X-eigenstate even if the control qubit is not in a computational basis state. To that end, the CNOT is surrounded by four Hadamard gates.

In some examples, a quantum circuit may include a controlled quantum gate followed immediately by measurement. Here, transforming the quantum circuit may include shifting the measurement in front of the controlled quantum gate if the control qubit is in a superposition state. FIG. 6 illustrates a transformation in which the measurement is shifted in front of and performed before application of the controlled gate. This transformation does not affect the overall operation of the circuit but allows the quantum-code simulator to simulate the operation, as the control qubit is guaranteed to be in a definite $|0\rangle$ or $|1\rangle$ state after the measurement.

In some examples, a quantum circuit may include a temporary parity computation between two qubits of the qubit register. Here, transforming the quantum circuit may include changing the target of a temporary parity computation. FIG. 7 illustrates a quantum-circuit transformation that changes the target of a temporary parity computation between qubits x and y. The target is changed by moving the diagonal gate, in this example, $$R_\theta := \begin{pmatrix} 1 & 0 \\ 0 & e^{i\theta} \end{pmatrix}, \quad (9)$$

to the new target. This approach preserves the separable-state representation while simulating the depicted circuit even if the qubity is not in $|0\rangle$ or $|1\rangle$, as long as x is not in a superposition.

For symmetric gates such as the controlled-Z gate, the quantum-code simulator may require one of the target qubits to be in a computational basis state. If the control qubit is in a superposition state but the target qubit is not, then the two may simply be exchanged due to the symmetry of this gate with respect to qubit permutation. This is similar to the circuit transformation of FIG. 7.

As described in further detail hereinafter, the ability to transform a wide range of quantum-circuits into a form that preserves separability is an advantage over the less generic Toffoli simulator. Returning now to FIG. 4, the quantum-code simulator signals failure at 54 if the quantum circuit includes a multi-qubit quantum gate or a controlled quantum gate with at least one control qubit in a superposition state, which is not transformed into a functionally equivalent quantum circuit that preserves separability of the quantum state as a product of individual quantum states of each qubit of the qubit register. This may occur if the attempt to transform the quantum circuit is not successful, as no equivalent circuit that preserves the separability of the quantum state of the qubit register is available. In other examples, as described hereinafter, the quantum-code simulator may not fail at the first instance of entanglement but may allow entanglement up to a certain point or over a finite interval. If the transformation attempt is successful, then the received instructions, at 56, are replaced by one or more new instructions corresponding to the transformed quantum circuit, which are then simulated at 50.

In some scenarios, the one or more instructions received at 46 may include a measurement to be enacted at runtime. At 58, therefore, the amplitudes of the array are adjusted pursuant to the measurement. In general, measurement of a qubit results collapses the quantum state of that qubit to one of the standard basis states, $|0\rangle$ or $|1\rangle$. Accordingly, if qubit i is measured, then amplitude $\alpha_i$ may be set to $\sqrt{\alpha_i^2 + \beta_i^2}$ and amplitude $\beta_i$ may zeroed, or vice versa.

In some scenarios, the one or more instructions received at 46 may include a deallocation instruction to be enacted at runtime. Upon deallocation, the quantum-code simulator removes one or more qubits from the set of live qubits. At 60, therefore, the amplitudes of the array are adjusted pursuant to the deallocation. In some examples, the simulator may, in addition to other actions and checks, free memory and/or assert that the qubit was in a computational basis state (for debugging purposes). One such check is to make sure that the overall phase remains zero, as described hereinafter.

At any point in method 40—e.g., on completion of adjustment steps 50, 58, and/or 60—one or more of the adjusted complex-valued amplitudes may be outputted computationally, in such form as to be receivable as input to a computer program. In one example, the complex-valued amplitudes may be provided as input to a computer program via an application programming interface (API). Outputting the one or more amplitudes may include passing amplitude values in a formal parameter list, exposing amplitude values via a procedure member of a quantum-code simulator object, etc. It will be understood that the computer program receiving the adjusted amplitudes may vary from one implementation to another. The receiving program may be integrated with or distinct from the quantum-code simulator. The receiving program may be configured for storage, graphical display, quantum-program testing, and/or further analysis, for example. After 60, method 40 may return to 46 where additional instructions may be received.

The functionality of the quantum-code simulator in method 40 may be extended to include testing and debugging of entire quantum programs. In addition to measurement-induced collapse of qubits onto $|0\rangle$ or $|1\rangle$, the simulator may allow inspection of the qubit state before the measurement, e.g., to ensure that the measurement was indeed deterministic and that the correct final state was not obtained by mere chance. Inspection also allows querying of the simulator for global phases, to ensure correct behavior when the tested circuit is run on a superposition of inputs or controlled on other qubits.

Figure 8:
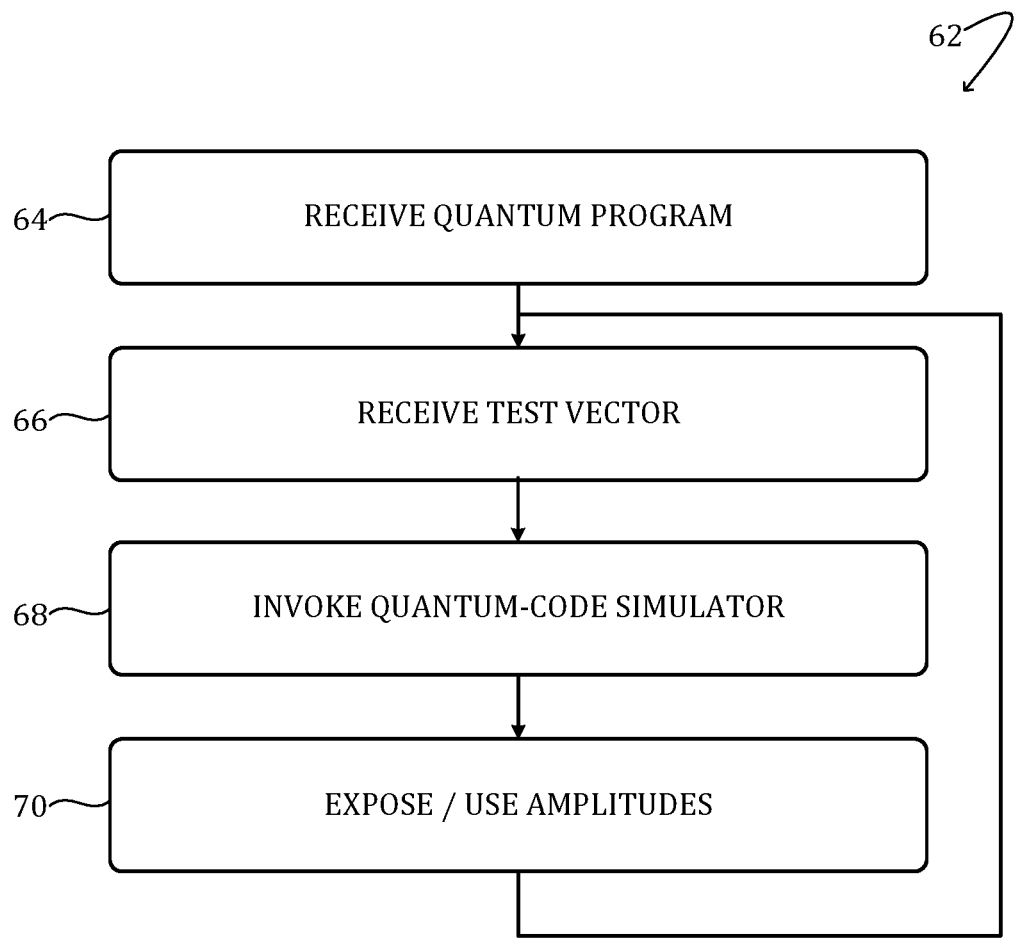
FIG. 8 shows aspects of an example method to debug a quantum program using the digital simulation method of FIG. 4.

FIG. 8 shows aspects of an example method 62 to test a quantum program configured for execution on a quantum computer. Method 62 may be implemented on a classical computer system as a computer program. The terms 'quantum-code debugger' and 'debugger' are used herein to describe computer-program implementations of method 62 and related methods.

At 64 of method 62, the quantum-code debugger receives a quantum program. To test and/or debug a given quantum procedure $U_f$ that implements classical functionality $x \mapsto f(x)$, e.g., $$|x\rangle|y\rangle \stackrel{U_f}{\mapsto} |x\rangle|y \oplus f(x)\rangle, \quad (10)$$

the procedure may be run on an arbitrary test vector of input bits $x_1 \ldots x_n$. At 66, accordingly, the debugger receives a test vector and initializes an array of complex-valued amplitudes (vide supra) based on the test vector.

At 68 the quantum-code debugger invokes the quantum-code simulator, thereby executing computer-implemented method 40 of FIG. 4. The quantum-code simulator may be invoked as a procedure, object, etc. At 70 the debugger computationally exposes one or more of the complex-valued amplitudes $\alpha_i$ and $\beta_i$ as adjusted by the simulator. Amplitudes may be exposed in such form as to be receivable as input to a computer program. In an object-oriented example, the quantum-code simulator object provides a member function get_amplitude(qubit_id, state), where qubit_id is an identifier (e.g., an integer) for a qubit, and state is a Boolean variable in $\{0, 1\}$, denoting which of the two amplitudes, $\alpha_{qubit\_id}$ corresponding to $|0\rangle$ or $\beta_{qubit\_id}$ corresponding to $|1\rangle$, to return. In these and other examples, the exposed amplitudes may be provided an output of the quantum-code debugger—in a formal parameter list, by exposing amplitude values via a procedure member of a quantum-code debugger object, etc. It will be understood that the computer program receiving the adjusted amplitudes may vary from one implementation to another. The receiving program may be integrated with or distinct from the debugger. The receiving program may be configured for storage, graphical display, quantum-program testing, and/or further analysis, for example.

In some examples, exposure of the complex-valued amplitudes at 70 facilitates extraction of a global phase of the quantum state of the qubit register. For instance, the global phase may be obtained based on the amplitudes exposed by multiplying the non-zero phase factors of all qubits of the qubit register. Since it is assumed that the state is a computational basis state, it holds that $|\alpha_i| \in \{0, 1\}$ for all qubit indices i. The overall state of n qubits may thus be written as $$(\alpha_1|0\rangle + \beta_1|1\rangle) \ldots (\alpha_n|0\rangle + \beta_n|1\rangle) = \alpha_1^{1-x_1}\beta_1^{x_1} \ldots \alpha_1^{1-x_1}\beta_1^{x_1} \ldots \alpha_n^{1-x_n}\beta_n^{x_n}|x_1\rangle \ldots |x_n\rangle, \quad (11)$$

where $x_i \in \{0, 1\}$ is 0 if and only if $|\alpha_i| = 1$.

The global phase may be checked whenever all live qubits are supposed to be in a computational basis state—e.g., after an addition has been carried out—by invoking member function assert_purely_classical( ). In some examples, this function may be configured to throw an exception upon encountering a superposition or a non-zero (global) phase.

In some scenarios, as noted above, the one or more instructions received at 46 of method 40 may include a deallocation instruction. In the present context of method 62, the quantum-code debugger may extract the global phase pursuant to the deallocation instruction. In that scenario, the phases of at least one deallocated qubit may be distributed elsewhere in the qubit register. In other words, if the quantum-code simulator releases memory when deallocating qubits, then the debugger may keep track of the global phase and either add the phases of deallocated qubits to one or more other qubits, or, to a designated accumulator variable, which must be taken into account when assert_purely_classical( ) is invoked.

Returning briefly to FIG. 8, after checking that the outcome is indeed a classical bit-string corresponding to $y \oplus f(x)$ with a trivial phase, the quantum-code debugger may repeat the simulation using a new test vector. In some examples, the text vector received at 66 may be one of a distribution of test vectors received; method 62 may be executed iteratively over the distribution of test vectors.

The procedure stops when a fault occurs or when enough test vectors have been sampled to ensure that the probability of an undiscovered fault is low. If a fault does occur, the quantum program may be subdivided in order to locate the faulty gate and, ultimately, repair the bug.

Presented hereinafter are results obtained using a prototype implementation of method 62 of FIG. 8. The implementation supports the features described herein, including quantum gates such as CNOT, single-qubit gates and measurement, in addition debugger features, such as checked deallocation of qubits, assert_purely_classical( ), and access to amplitudes via get_amplitude( ).

As benchmarks for the scalability of the quantum-code simulator, basic arithmetic functionality was chosen as encountered in, e.g., Shor's algorithm for factoring. Results are presented for simulated addition and multiplication, for various bit-sizes. Both of the simulated quantum programs feature non-Toffoli gates, including measurement-based uncomputation of so-called AND gates. As such, it would be impossible to test the programs at the examined scale using state-of-the-art methods. The implementations of the adder and the controlled adder (for multiplication) are from, which employs the optimized Toffoli gates from. Runtimes were measured on a single core of a Intel® Core™ i7-8550U CPU @ 1.80 GHz.

Figure 9:
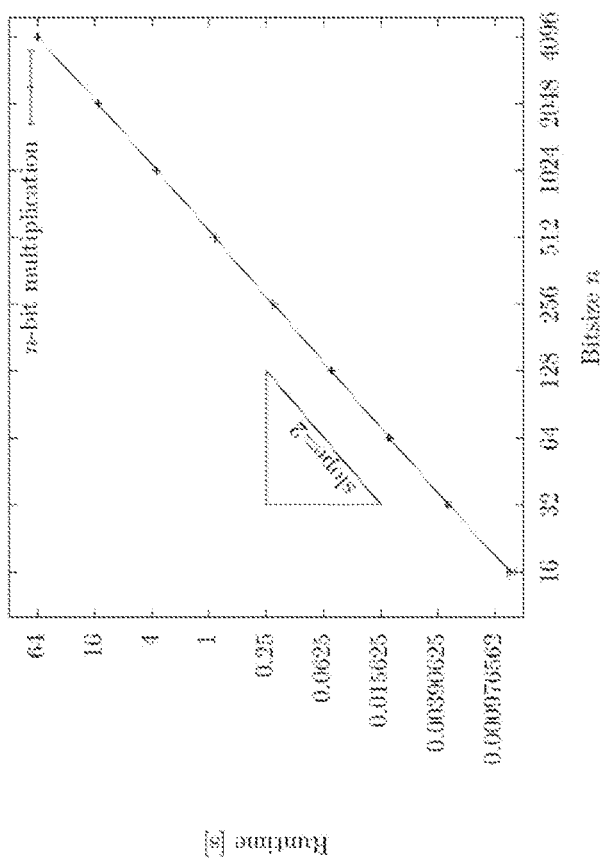
FIG. 9 is an example plot of time taken to simulate addition of two n-bit numbers using the digital simulation method of FIG. 4.

FIG. 9 is an example plot of time taken to simulate addition of two n-bit numbers, $(x, y) \mapsto (x, y+x)$, as a function of n. As noted above, the implementation is based on temporary AND gates and uncomputation using measurement, making it impossible to simulate the program on a Toffoli simulator.

Figure 10:
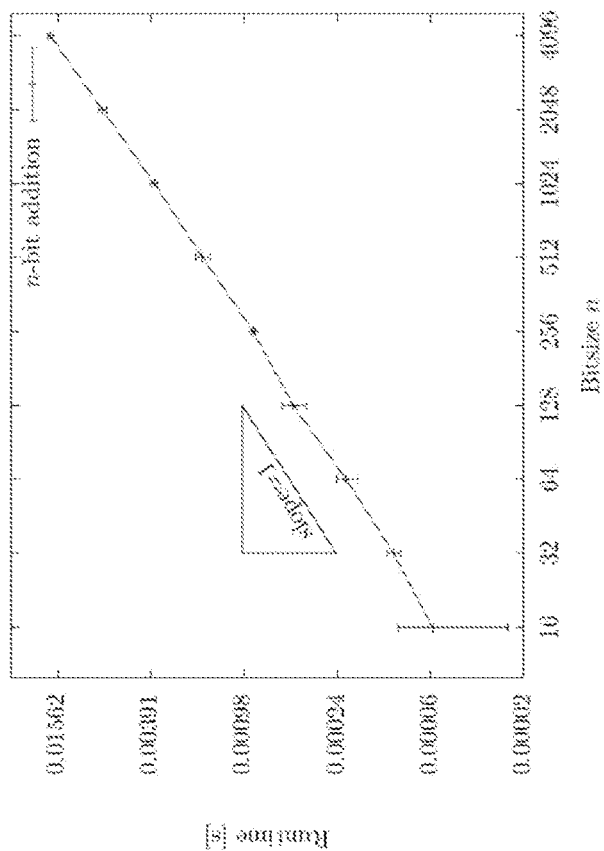
FIG. 10 is an example plot of time taken to simulate multiplication of two n-bit numbers using the digital simulation method of FIG. 4.

FIG. 10 is an example plot of time taken to simulate multiplication of two n-bit numbers into a third 2n-bit register, $(x, y, 0) \mapsto (x, y, x \cdot y)$, as a function of n. The implementation uses n controlled adders that are implemented using non-Toffoli gates such as temporary ANDs and measurement-based uncomputation, making it impossible to simulate the program on a Toffoli simulator.

The results above show that a separable-state simulator, as illustrated in FIG. 4, can allow full simulation of quantum circuits at application-scale (e.g., Shor's algorithm for factoring), whereas traditional methods such as full-state simulation would require storage of $2^{4n+3}$ bytes, making such an approach impractical. Significantly, the separable-state approach requires only two complex numbers (16 bytes in double precision) per qubit and a constant number of floating-point operations per quantum gate, resulting in linear runtime as a function of the number of gates in the quantum circuit.

These results directly demonstrate significant improvement in the operation of a classical computer system tasked with simulating the evolving quantum state of a qubit register of a functioning quantum computer. In particular, the improved computer system can handle a broader range of quantum circuits than an analogous system running a Toffoli simulator. Further, the improved computer system runs faster and offers more reserve bandwidth than an analogous system running a full-state simulator. In addition, the demonstrated success of the disclosed simulation and testing methods improve the operation of quantum computers because they permit full-scale testing of a wide range of quantum programs. As noted above, quantum circuits that use non-Toffoli gates are incompatible with Toffoli simulation, while full-state simulation is impractical for programs that allocate more than 30 or 40 qubits. Accordingly, absent efficient and generic simulation methods as disclosed herein, quantum computers themselves would be required for testing and debugging quantum-program code, which would be a vastly inefficient use of quantum-computer resources.

No aspect of any of the methods herein should be understood in a limiting sense, because numerous variations, extensions, and omissions are also envisaged. For instance, the quantum-code simulation method of FIG. 4 can be extended in various ways that, to some degree, relax the underlying separability condition.

In some examples, a quantum-code simulator based on separability may be combined with any of the known types of simulators or emulators (full-state, Toffoli, etc.), which operate on different principles. Program code may be parsed into discrete quantum circuits that are analyzed and directed to the appropriate simulator based on the specificalities of the quantum gates therein. For example, a combined approach would enable quantum circuits that operate on a separable qubit state, and preserve separability, to be simulated with high efficiency, while other quantum circuits are submitted for slower, full-state simulation. Combined approaches may also be useful for simulations that allow qubit entanglement over a finite simulation interval.

In methods otherwise analogous to method 40, the quantum state of the qubit register may be separable as a product of mutually non-entangled quantum states of relatively small subsets of qubits of the qubit register. The change in the quantum state effected by each quantum circuit may be required to preserve the separability of the quantum state as a product of the mutually non-entangled quantum states of the subsets. This approach may allow entangled states up to a certain size—e.g., up to some limit dictated by the classical hardware. Furthermore, an extended range of controlled quantum gates may be handled by a generalized separable state simulator that allows for some degree of entanglement.

In some examples, at least one of the relatively small subsets of qubits includes mutually entangled qubits that disentangle on continued execution of the quantum program. That approach may allow inseparable states temporarily, i.e., over a finite simulation interval as noted above.

The methods herein may be tied to a computer system of one or more computing devices. Such methods and processes may be implemented as an application program or service, an application programming interface (API), a library, and/or other computer-program product.

Figure 11:
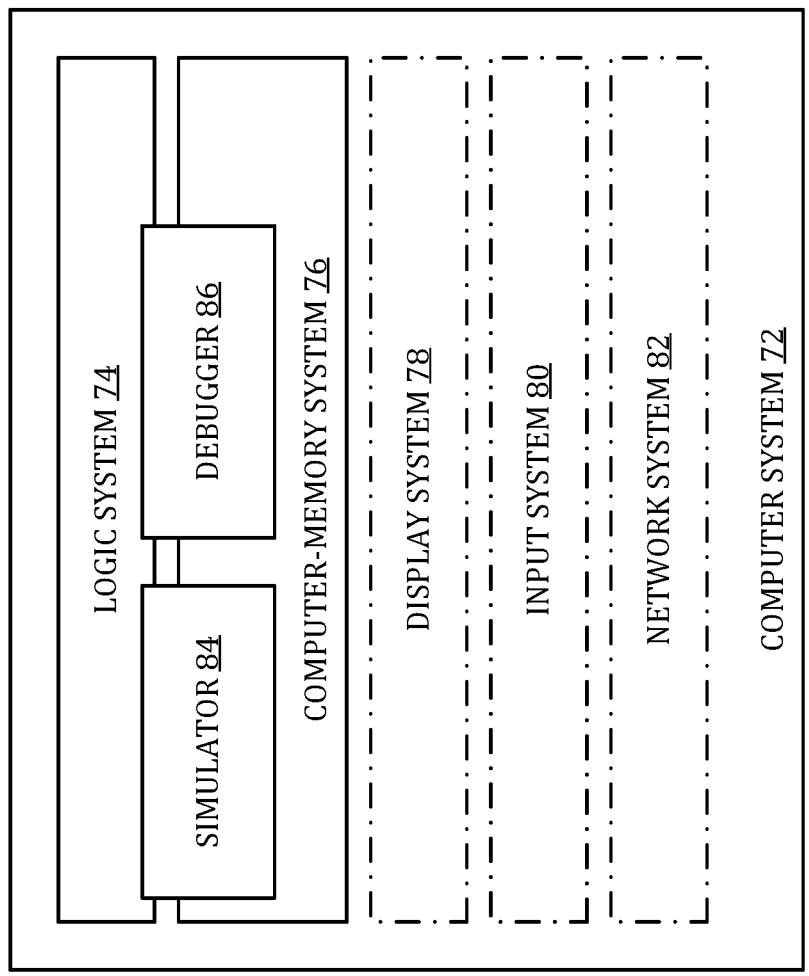
FIG. 11 shows aspects of an example computer system.

FIG. 11 provides a schematic representation of a computer system 72 configured to provide some or all of the computer system functionality disclosed herein. Computer system 72 may take the form of a personal computer, application-server computer, or any other computing device.

Computer system 72 includes a logic system 74 and a computer-memory system 76. Computer system 72 may optionally include a display system 78, an input system 80, a network system 82, and/or other systems not shown in the drawings.

Logic system 74 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 76 includes at least one physical device configured to temporarily and/or permanently hold computer system information, such as data and instructions executable by logic system 74. In the illustrated example, computer-memory system 76 is holding instruction code corresponding to quantum-code simulator 84 and debugger 86. When the computer-memory system includes two or more devices, the devices may be collocated or remotely located. Computer-memory system 76 may include at least one volatile, nonvolatile, dynamic, static, read/write, read-only, random-access, sequential-access, location-addressable, file-addressable, and/or content-addressable computer-memory device. Computer-memory system 76 may include at least one removable and/or built-in computer-memory device. When the logic system executes instructions, the state of computer-memory system 76 may be transformed—e.g., to hold different data.

Aspects of logic system 74 and computer-memory system 76 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 74 and computer-memory system 76 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of machine learning (ML) and artificial intelligence (AI) techniques. Non-limiting examples of techniques that may be incorporated in an implementation of one or more machines include support vector machines, multilayer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 78 may be used to present a visual representation of data held by computer-memory system 76. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 80 may comprise or interface with one or more input devices. An input device may include a sensor device or a user input device. Examples of user input devices include a keyboard, mouse, or touch screen.

When included, network system 82 may be configured to communicatively couple computer system 72 with one or more other computer systems. The network system may include wired and/or wireless communication devices compatible with one or more different communication protocols. The network system may be configured for communication via personal-, local- and/or wide-area networks.

For additional context, the following references are hereby incorporated herein by reference, for all purposes.

Cody Jones. Low-overhead constructions for the fault-tolerant toffoli gate. *Physical Review A*, 87(2):022328, 2013.

Thomas Häner, Martin Roetteler, and Krysta Svore. Factoring using 2n+2 qubits with Toffoli based modular multiplication. *Quantum Information and Computation*, 18(7&8):673-684, 2017.

Thomas G Draper. Addition on a quantum computer system. *arXiv preprint quant-ph/*0008033, 2000.

Michael A Nielsen and Isaac Chuang. *Quantum computation and quantum information*, 2002.

Thomas Häner, Damian S Steiger, Mikhail Smelyanskiy, and Matthias Troyer.

High performance emulation of quantum circuits. In *SC'16: Proceedings of the International Conference for High Performance Computing, Networking, Storage and Analysis*, pages 866{874. IEEE, 2016.

Thomas Häner and Damian S Steiger. 0.5 petabyte simulation of a 45-qubit quantum circuit. In *Proceedings of the International Conference for High Performance Computing, Networking, Storage and Analysis*, pages 1-10, 2017.

Scott Aaronson and Daniel Gottesman. Improved simulation of stabilizer circuits. *Physical Review A*, 70(5):072328, 2004.

Sergey Bravyi and David Gosset. Improved classical simulation of quantum circuits dominated by clifford gates. *Physical review letters*, 116(25):250501, 2016.

Craig Gidney. Halving the cost of quantum addition. *Quantum*, 2:74, 2018.

This disclosure is presented by way of example and with reference to the appended drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

One aspect of this disclosure is directed to a method, enacted in a computer system, to digitally simulate an evolving quantum state of a qubit register of a quantum computer. The method comprises: representing the quantum state as an array of complex-valued amplitudes, where each amplitude is associated with an individual qubit of the qubit register, and where the quantum state is separable as a product of individual quantum states of each qubit of the qubit register; receiving one or more quantum-program instructions corresponding to a quantum circuit; adjusting the amplitudes of the array to reflect a change in the quantum state pursuant to execution of the quantum circuit, wherein the change preserves separability of the quantum state as a product of individual quantum states of each qubit of the qubit register; and computationally outputting, in such form as to be receivable as input to a computer program, one or more of the amplitudes as adjusted.

In some implementations, the array includes, for each qubit i of the qubit register, a complex-valued amplitude $\alpha_i$ representing a contribution of standard basis $|0\rangle$ for that qubit and a complex-valued amplitude $\beta_i$ representing the contribution of standard basis $|1\rangle$ for that qubit. In some implementations, each quantum gate of the quantum circuit is a single-qubit quantum gate. In some implementations, each control qubit of the quantum circuit is in a standard basis state. In some implementations, the quantum circuit includes a multi-qubit quantum gate or a controlled quantum gate with at least one control qubit in a superposition state, the method further comprising: transforming the quantum circuit to a functionally equivalent quantum circuit that preserves separability of the quantum state as a product of individual quantum states of each qubit of the qubit register; and prior to adjusting the amplitudes, replacing the one or more instructions to correspond to the functionally equivalent quantum circuit. In some implementations, the quantum circuit includes a controlled quantum gate with at least one control qubit in a superposition state, and transforming the quantum circuit includes exchanging control and target qubits of the controlled quantum gate. In some implementations, the quantum circuit includes a controlled quantum gate followed immediately by measurement, and transforming the quantum circuit includes shifting the measurement in front of the controlled quantum gate. In some implementations, transforming the quantum circuit includes changing a target of a temporary parity computation between two qubits of the qubit register. In some implementations, the method further comprises signaling failure if the quantum circuit includes a multi-qubit quantum gate or a controlled quantum gate with at least one control qubit in a superposition state, which is not transformed into a functionally equivalent quantum circuit that preserves separability of the quantum state as a product of individual quantum states of each qubit of the qubit register. In some implementations, the one or more instructions include an allocation instruction, the method further comprising representing an additional qubit of the qubit register pursuant to the allocation instruction. In some implementations, the one or more instructions include a measurement instruction, the method further comprising zeroing at least one of the amplitudes pursuant to the measurement instruction. In some implementations, the one or more instructions include a deallocation instruction, the method further comprising adjusting the amplitudes of the array to reflect removal of at least one qubit from the qubit register pursuant to the deallocation instruction. In some implementations, the quantum circuit includes an X quantum gate, a CNOT quantum gate, or an n-ary controlled NOT quantum gate.

Another aspect of this disclosure is directed to a method, enacted in a computer system, to test a quantum program configured for execution on a quantum computer. The method comprises: receiving the quantum program; representing an evolving quantum state of a qubit register of the quantum computer as an array of complex-valued amplitudes, where each amplitude is associated with an individual qubit of the qubit register, and where the quantum state is separable as a product of individual quantum states of each qubit of the qubit register; retrieving from the quantum program one or more instructions corresponding to a quantum circuit; adjusting the amplitudes of the array to reflect a change in the quantum state pursuant to execution of the quantum circuit, wherein the change preserves separability of the quantum state as a product of individual quantum states of each qubit of the qubit register; and computationally exposing, in such form as to be receivable as input to a computer program, one or more of the amplitudes as adjusted.

In some implementations, the method further comprises receiving a test vector and initializing the array of complex-valued amplitudes based on the test vector. In some implementations, the text vector is one of a distribution of test vectors received, and the method is executed iteratively over the distribution of test vectors. In some implementations, the method further comprises extracting a global phase of the quantum state based on the amplitudes exposed. In some implementations, the one or more instructions include a deallocation instruction, and the global phase is extracted pursuant to the deallocation instruction, the method further comprising distributing a phases of at least one deallocated qubit elsewhere in the qubit register.

Another aspect of this disclosure is directed to a method, enacted in a computer system, to digitally simulate an evolving quantum state of a qubit register of a quantum computer. The method comprises: representing the quantum state as an array of complex-valued amplitudes, where each amplitude is associated with an individual qubit of the qubit register, and where the quantum state is separable as a product of mutually non-entangled quantum states of subsets of qubits of the qubit register; receiving one or more quantum-program instructions corresponding to a quantum circuit; adjusting the amplitudes of the array to reflect a change in the quantum state pursuant to execution of the quantum circuit, wherein the change preserves separability of the quantum state as a product of the mutually non-entangled quantum states of the subsets of qubits of the qubit register; and computationally outputting, in such form as to be receivable as input to a computer program, one or more of the amplitudes as adjusted.

In some implementations, the one or more instructions are retrieved from a quantum program, and wherein at least one of the subsets of qubits includes mutually entangled qubits that disentangle on continued execution of the quantum program.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method enacted in a computer system to digitally simulate an evolving quantum state of a qubit register of a quantum computer, the method comprising:
representing the quantum state as an array of complex-valued amplitudes, where each amplitude is associated with an individual qubit of the qubit register, and where the quantum state is separable as a product of individual quantum states of each qubit of the qubit register;
receiving one or more quantum-program instructions corresponding to a quantum circuit;
adjusting the amplitudes of the array to reflect a change in the quantum state pursuant to execution of the quantum circuit, wherein the change preserves separability of the quantum state as a product of individual quantum states of each qubit of the qubit register; and
computationally outputting, in such form as to be receivable as input to a computer program, one or more of the amplitudes as adjusted.

2. The method of claim 1 wherein the array includes, for each qubit i of the qubit register:
a complex-valued amplitude $\alpha_i$ representing a contribution of standard basis |0⟩ for that qubit, and
a complex-valued amplitude $\beta_i$ representing the contribution of standard basis |1⟩ for that qubit.

3. The method of claim 1 wherein each quantum gate of the quantum circuit is a single-qubit quantum gate.

4. The method of claim 1 wherein each control qubit of the quantum circuit is in a standard basis state.

5. The method of claim 1 wherein the quantum circuit includes a multi-qubit quantum gate or a controlled quantum gate with at least one control qubit in a superposition state, the method further comprising:
transforming the quantum circuit to a functionally equivalent quantum circuit that preserves separability of the quantum state as a product of individual quantum states of each qubit of the qubit register; and
prior to adjusting the amplitudes, replacing the one or more instructions to correspond to the functionally equivalent quantum circuit.

6. The method of claim 5 wherein the quantum circuit includes a controlled quantum gate with at least one control qubit in a superposition state, and wherein transforming the quantum circuit includes exchanging control and target qubits of the controlled quantum gate.

7. The method of claim 5 wherein the quantum circuit includes a controlled quantum gate followed immediately by measurement, and wherein transforming the quantum circuit includes shifting the measurement in front of the controlled quantum gate.

8. The method of claim 5 wherein transforming the quantum circuit includes changing a target of a temporary parity computation between two qubits of the qubit register.

9. The method of claim 1 further comprising signaling failure if the quantum circuit includes a multi-qubit quantum gate or a controlled quantum gate with at least one control qubit in a superposition state, which is not transformed into a functionally equivalent quantum circuit that preserves separability of the quantum state as a product of individual quantum states of each qubit of the qubit register.

10. The method of claim 1 wherein the one or more instructions include an allocation instruction, the method further comprising representing an additional qubit of the qubit register pursuant to the allocation instruction.

11. The method of claim 1 wherein the one or more instructions include a measurement instruction, the method further comprising zeroing at least one of the amplitudes pursuant to the measurement instruction.

12. The method of claim 1 wherein the one or more instructions include a deallocation instruction, the method further comprising adjusting the amplitudes of the array to reflect removal of at least one qubit from the qubit register pursuant to the deallocation instruction.

13. The method of claim 1 wherein the quantum circuit includes an X quantum gate, a CNOT quantum gate, or an n-ary controlled NOT quantum gate.

14. A method enacted in a computer system to test a quantum program configured for execution on a quantum computer, the method comprising:
    receiving the quantum program;
    representing an evolving quantum state of a qubit register of the quantum computer as an array of complex-valued amplitudes, where each amplitude is associated with an individual qubit of the qubit register, and where the quantum state is separable as a product of individual quantum states of each qubit of the qubit register;
    retrieving from the quantum program one or more instructions corresponding to a quantum circuit;
    adjusting the amplitudes of the array to reflect a change in the quantum state pursuant to execution of the quantum circuit, wherein the change preserves separability of the quantum state as a product of individual quantum states of each qubit of the qubit register; and
    computationally exposing, in such form as to be receivable as input to a computer program, one or more of the amplitudes as adjusted.

15. The method of claim 14 further comprising receiving a test vector and initializing the array of complex-valued amplitudes based on the test vector.

16. The method of claim 15 wherein the text vector is one of a distribution of test vectors received, and wherein the method is executed iteratively over the distribution of test vectors.

17. The method of claim 14 further comprising extracting a global phase of the quantum state based on the amplitudes exposed.

18. The method of claim 17 wherein the one or more instructions include a deallocation instruction, and wherein the global phase is extracted pursuant to the deallocation instruction, the method further comprising distributing a phases of at least one deallocated qubit elsewhere in the qubit register.

19. A method enacted in a computer system to digitally simulate an evolving quantum state of a qubit register of a quantum computer, the method comprising:
    representing the quantum state as an array of complex-valued amplitudes, where each amplitude is associated with an individual qubit of the qubit register, and where the quantum state is separable as a product of mutually non-entangled quantum states of subsets of qubits of the qubit register;
    receiving one or more quantum-program instructions corresponding to a quantum circuit;
    adjusting the amplitudes of the array to reflect a change in the quantum state pursuant to execution of the quantum circuit, wherein the change preserves separability of the quantum state as a product of the mutually non-entangled quantum states of the subsets of qubits of the qubit register; and
    computationally outputting, in such form as to be receivable as input to a computer program, one or more of the amplitudes as adjusted.

20. The method of claim 19 wherein the one or more instructions are retrieved from a quantum program, and wherein at least one of the subsets of qubits includes mutually entangled qubits that disentangle on continued execution of the quantum program.

* * * * *